US010274819B2

(12) United States Patent
Hsu et al.

(10) Patent No.: US 10,274,819 B2
(45) Date of Patent: Apr. 30, 2019

(54) EUV PELLICLE FABRICATION METHODS AND STRUCTURES THEREOF

(71) Applicant: TAIWAN SEMICONDUCTOR MANUFACTURING COMPANY, LTD., Hsin-Chu (TW)

(72) Inventors: Pei-Cheng Hsu, Taipei (TW); Chih-Tsung Shih, Hsinchu (TW); Jeng-Horng Chen, Hsin-Chu (TW); Chih-Cheng Lin, Kaohsiung (TW); Hsin-Chang Lee, Zhubei (TW); Shinn-Sheng Yu, Hsinchu (TW); Ta-Cheng Lien, Cyonglin Township, Hsinchu County (TW); Anthony Yen, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/615,185

(22) Filed: Feb. 5, 2015

(65) Prior Publication Data
US 2016/0231647 A1    Aug. 11, 2016

(51) Int. Cl.
| | |
|---|---|
| *B44C 1/22* | (2006.01) |
| *C25F 3/00* | (2006.01) |
| *C23F 1/00* | (2006.01) |
| *C23F 3/00* | (2006.01) |
| *G03F 1/62* | (2012.01) |

(52) U.S. Cl.
CPC ...................................... *G03F 1/62* (2013.01)

(58) Field of Classification Search
CPC .......... G03F 1/62; G03F 1/22; G02B 27/0018
USPC ............................................................ 216/41
See application file for complete search history.

(56) References Cited

U.S. PATENT DOCUMENTS

| | | | |
|---|---|---|---|
| 6,097,142 A * | 8/2000 | Ko | H01J 29/07 313/402 |
| 8,628,897 B1 | 1/2014 | Lu et al. | |
| 8,679,707 B2 | 3/2014 | Lee et al. | |
| 8,691,476 B2 | 4/2014 | Yu et al. | |
| 8,709,682 B2 | 4/2014 | Chen et al. | |
| 8,715,890 B2 | 5/2014 | Tu et al. | |
| 8,722,286 B2 | 5/2014 | Yu et al. | |
| 8,753,788 B1 | 6/2014 | Yu et al. | |
| 8,764,995 B2 | 7/2014 | Chang et al. | |
| 8,765,330 B2 | 7/2014 | Shih et al. | |
| 8,765,582 B2 | 7/2014 | Hsu et al. | |
| 8,785,084 B2 | 7/2014 | Lu et al. | |
| 8,828,625 B2 | 9/2014 | Lu et al. | |

(Continued)

*Primary Examiner* — Thomas T Pham
(74) *Attorney, Agent, or Firm* — Haynes and Boone, LLP

(57) ABSTRACT

A method for fabricating a pellicle for EUV lithography processes includes placing a hard mask in contact with a surface of a substrate. In some embodiments, the hard mask is configured to pattern the surface of the substrate to include a first region and a second region surrounding the first region. By way of example, while the mask in positioned in contact with the substrate, an etch process of the substrate is performed to etch the first and second regions into the substrate. Thereafter, an excess substrate region is removed so as to separate the etched first region from the excess substrate region. In various embodiments, the etched and separated first region serves as a pellicle for an extreme ultraviolet (EUV) lithography process.

20 Claims, 10 Drawing Sheets

(56) References Cited

U.S. PATENT DOCUMENTS

| | | | |
|---|---|---|---|
| 8,841,047 B2 | 9/2014 | Yu et al. | |
| 8,877,409 B2 | 11/2014 | Hsu et al. | |
| 2002/0077039 A1* | 6/2002 | Wenski | H01L 21/02024 451/41 |
| 2003/0207505 A1* | 11/2003 | Theiss | B82Y 10/00 438/158 |
| 2006/0032832 A1* | 2/2006 | Choi | G02B 6/136 216/24 |
| 2013/0092081 A1* | 4/2013 | De | C23C 14/042 118/504 |
| 2014/0340900 A1* | 11/2014 | Bathurst | F21K 9/00 362/249.02 |
| 2015/0168824 A1* | 6/2015 | Sun | G03F 1/64 430/5 |
| 2015/0243558 A1* | 8/2015 | Anselm | H01S 5/0202 438/462 |

* cited by examiner

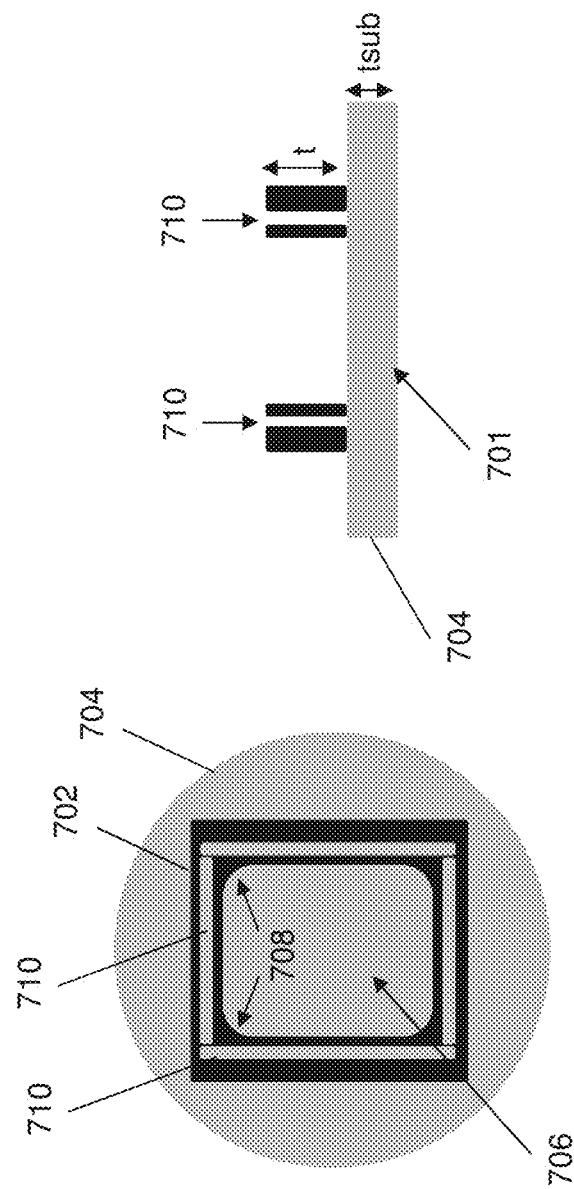

US 10,274,819 B2

EUV PELLICLE FABRICATION METHODS AND STRUCTURES THEREOF

BACKGROUND

The electronics industry has experienced an ever increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

As merely one example, semiconductor lithography processes may use lithographic templates (e.g., photomasks or reticles) to optically transfer patterns onto a substrate. Such a process may be accomplished, for example, by projection of a radiation source, through an intervening photomask or reticle, onto the substrate having a photosensitive material (e.g., photoresist) coating. The minimum feature size that may be patterned by way of such a lithography process is limited by the wavelength of the projected radiation source. In view of this, extreme ultraviolet (EUV) radiation sources and lithographic processes have been introduced. However, EUV systems, which utilize reflective rather than conventional refractive optics, are very sensitive to contamination issues. In one example, particle contamination introduced onto a reflective EUV mask can result in significant degradation of the lithographically transferred pattern. As such, it is necessary to provide a pellicle membrane over an EUV mask, to serve as a protective cover which protects the EUV mask from damage and/or contaminant particles. Additionally, to avoid a drop is reflectivity, it is important to use a thin, high-transmission material as the pellicle membrane. However, the fabrication of large, thin pellicle membranes according to certain conventional fabrication processes may cause the pellicle membrane to become distorted, wrinkled, broken, or otherwise damaged, thereby rendering the pellicle membrane unusable. Thus, existing EUV mask pellicle fabrication techniques have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 7A is a top-view and FIG. 7B is a cross-sectional view of an embodiment of a substrate and a hard mask, according to one or more aspects of the method of FIG. 6;

DETAILED DESCRIPTION

Figure 1:
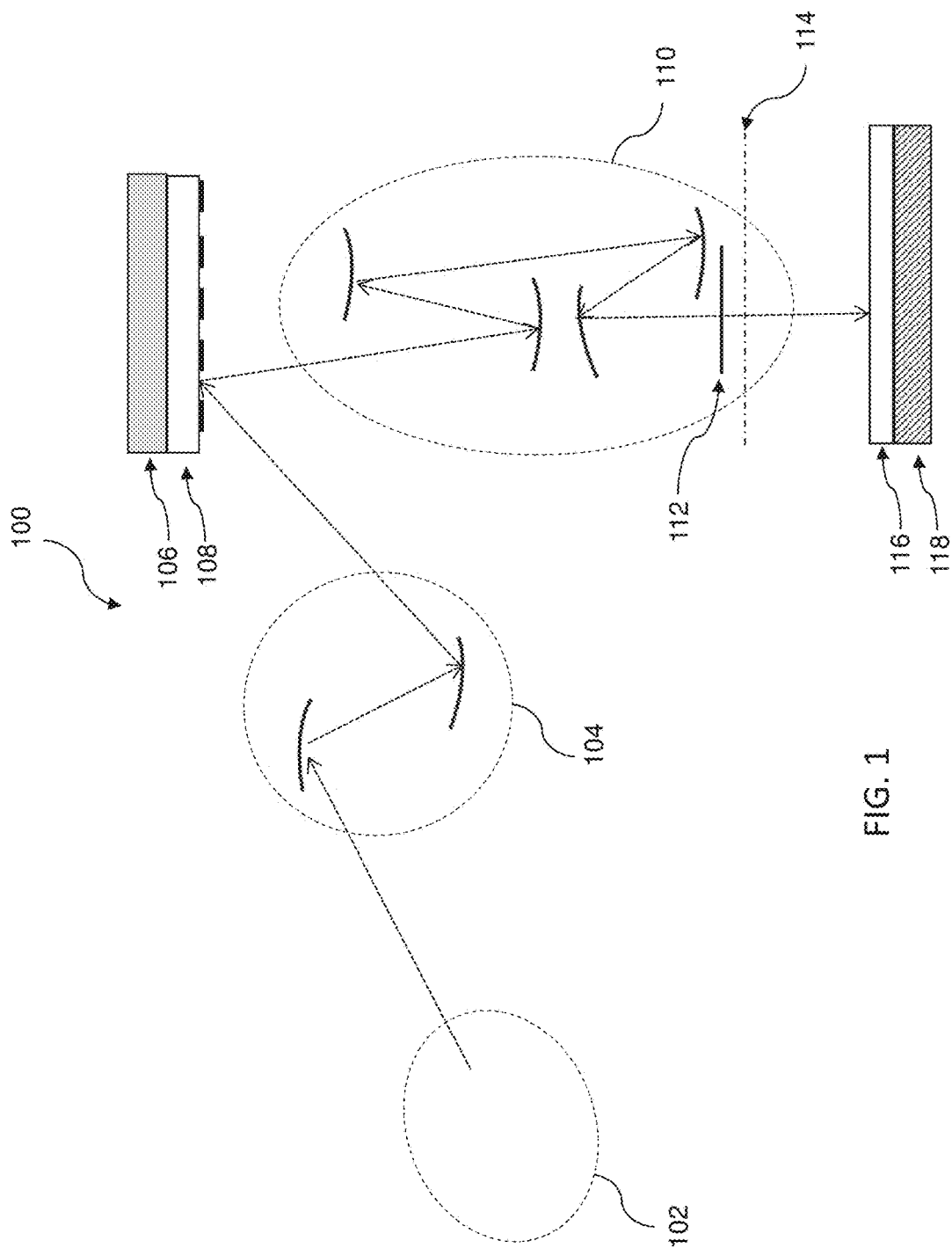
FIG. 1 is a schematic view of a lithography system, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Additionally, throughout the present disclosure, the terms "mask", "photomask", and "reticle" may be used interchangeably to refer to a lithographic template, such as an EUV mask.

Illustrated in FIG. 1 is a schematic view of a lithography system 100, in accordance with some embodiments. The lithography system 100 may also be generically referred to as a scanner that is operable to perform lithographic processes including exposure with a respective radiation source and in a particular exposure mode. In at least some of the present embodiments, the lithography system 100 includes an extreme ultraviolet (EUV) lithography system designed to expose a resist layer by EUV light. Inasmuch, in various embodiments, the resist layer includes a material sensitive to the EUV light (e.g., an EUV resist). The lithography system 100 of FIG. 1 includes a plurality of subsystems such as a radiation source 102, an illuminator 104, a mask stage 106 configured to receive a mask 108, projection optics 110, and a substrate stage 118 configured to receive a semiconductor substrate 116. A general description of the operation of the lithography system 100 may be given as follows: EUV light from the radiation source 102 is directed toward the illuminator 104 (which includes a set of reflective mirrors) and projected onto the reflective mask 108. A reflected mask image is directed toward the projection optics 110, which focuses the EUV light and projects the EUV light onto the semiconductor substrate 116 to expose an EUV resist layer deposited thereupon. Additionally, in various examples, each subsystem of the lithography system 100 may be housed in, and thus operate within, a high-vacuum environment, for example, to reduce atmospheric absorption of EUV light.

In the embodiments described herein, the radiation source 102 may be used to generate the EUV light. In some embodiments, the radiation source 102 includes a plasma source, such as for example, a discharge produced plasma (DPP) or a laser produced plasma (LPP). In some examples, the EUV light may include light having a wavelength ranging from about 1 nm to about 100 nm. In one particular example, the radiation source 102 generates EUV light with a wavelength centered at about 13.5 nm. Accordingly, the radiation source 102 may also be referred to as an EUV radiation source 102. In some embodiments, the radiation source 102 also includes a collector, which may be used to collect EUV light generated from the plasma source and to direct the EUV light toward imaging optics such as the illuminator 104.

As described above, light from the radiation source 102 is directed toward the illuminator 104. In some embodiments, the illuminator 104 may include reflective optics (e.g., for the EUV lithography system 100), such as a single mirror or a mirror system having multiple mirrors in order to direct light from the radiation source 102 onto the mask stage 106, and particularly to the mask 108 secured on the mask stage 106. In some examples, the illuminator 104 may include a zone plate, for example, to improve focus of the EUV light. In some embodiments, the illuminator 104 may be configured to shape the EUV light passing therethrough in accordance with a particular pupil shape, and including for example, a dipole shape, a quadrapole shape, an annular shape, a single beam shape, a multiple beam shape, and/or a combination thereof. In some embodiments, the illuminator 104 is operable to configure the mirrors (i.e., of the illuminator 104) to provide a desired illumination to the mask 108. In one example, the mirrors of the illuminator 104 are configurable to reflect EUV light to different illumination positions. In some embodiments, a stage prior to the illuminator 104 may additionally include other configurable mirrors that may be used to direct the EUV light to different illumination positions within the mirrors of the illuminator 104. In some embodiments, the illuminator 104 is configured to provide an on-axis illumination (ONI) to the mask 108. In some embodiments, the illuminator 104 is configured to provide an off-axis illumination (OAI) to the mask 108. It should be noted that the optics employed in the EUV lithography system 100, and in particular optics used for the illuminator 104 and the projection optics 110, may include mirrors having multilayer thin-film coatings known as Bragg reflectors. By way of example, such a multilayer thin-film coating may include alternating layers of Mo and Si, which provides for high reflectivity at EUV wavelengths (e.g., about 13 nm).

As discussed above, the lithography system 100 also includes the mask stage 106 configured to secure the mask 108. Since the lithography system 100 may be housed in, and thus operate within, a high-vacuum environment, the mask stage 106 may include an electrostatic chuck (e-chuck) to secure the mask 108. As with the optics of the EUV lithography system 100, the mask 108 is also reflective. Details of the mask 108 are discussed in more detail below with reference to the example of FIG. 2. As illustrated in the example of FIG. 1, light is reflected from the mask 108 and directed towards the projection optics 110, which collects the EUV light reflected from the mask 108. By way of example, the EUV light collected by the projection optics 110 (reflected from the mask 108) carries an image of the pattern defined by the mask 108. In various embodiments, the projection optics 110 provides for imaging the pattern of the mask 108 onto the semiconductor substrate 116 secured on the substrate stage 118 of the lithography system 100. In particular, in various embodiments, the projection optics 110 focuses the collected EUV light and projects the EUV light onto the semiconductor substrate 116 to expose an EUV resist layer deposited on the semiconductor substrate 116. As described above, the projection optics 110 may include reflective optics, as used in EUV lithography systems such as the lithography system 100. In some embodiments, the illuminator 104 and the projection optics 110 are collectively referred to as an optical module of the lithography system 100.

In some embodiments, the lithography system 100 also includes a pupil phase modulator 112 to modulate an optical phase of the EUV light directed from the mask 108, such that the light has a phase distribution along a projection pupil plane 114. In some embodiments, the pupil phase modulator 112 includes a mechanism to tune the reflective mirrors of the projection optics 110 for phase modulation. For example, in some embodiments, the mirrors of the projection optics 110 are configurable to reflect the EUV light through the pupil phase modulator 112, thereby modulating the phase of the light through the projection optics 110. In some embodiments, the pupil phase modulator 112 utilizes a pupil filter placed on the projection pupil plane 114. By way of example, the pupil filter may be employed to filter out specific spatial frequency components of the EUV light reflected from the mask 108. In some embodiments, the pupil filter may serve as a phase pupil filter that modulates the phase distribution of the light directed through the projection optics 110.

As discussed above, the lithography system 100 also includes the substrate stage 118 to secure the semiconductor substrate 116 to be patterned. In various embodiments, the semiconductor substrate 116 includes a semiconductor wafer, such as a silicon wafer, germanium wafer, silicon-germanium wafer, III-V wafer, or other type of wafer as known in the art. The semiconductor substrate 116 may be coated with a resist layer (e.g., an EUV resist layer) sensitive to EUV light. EUV resists may have stringent performance standards. For purposes of illustration, an EUV resist may be designed to provide at least around 22 nm resolution, at least around 2 nm line-width roughness (LWR), and with a sensitivity of at least around 15 mJ/cm$^2$. In the embodiments described herein, the various subsystems of the lithography system 100, including those described above, are integrated and are operable to perform lithography exposing processes including EUV lithography processes. To be sure, the lithography system 100 may further include other modules or subsystems which may be integrated with (or be coupled to) one or more of the subsystems or components described herein.

Figure 2:
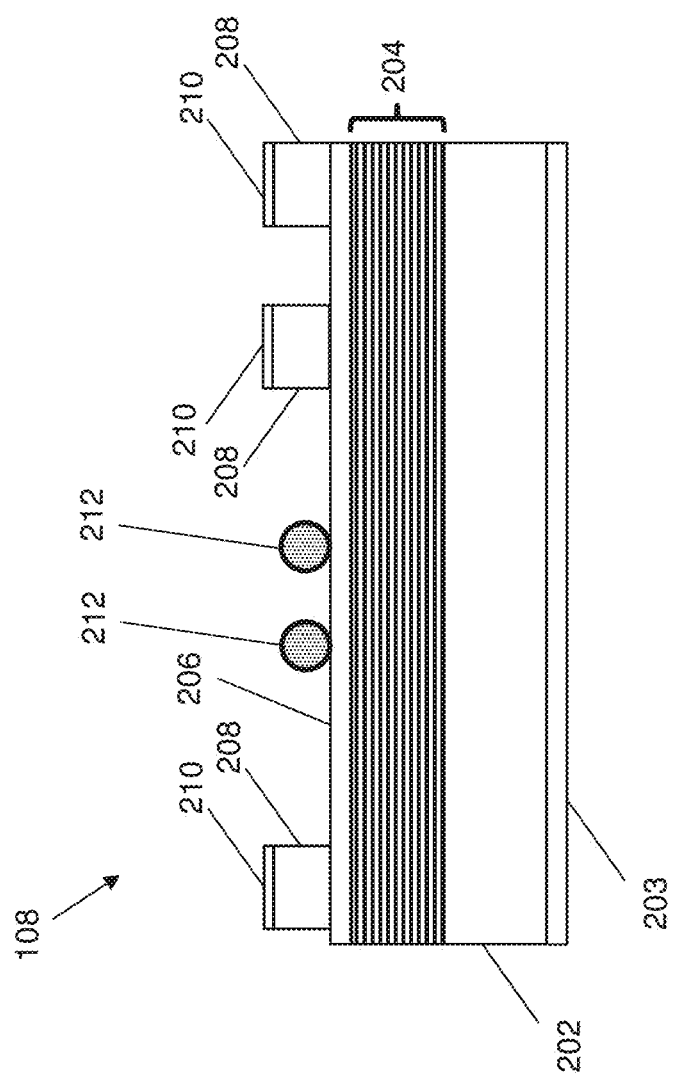
FIG. 2 is a cross-section of an EUV mask, in accordance with some embodiments.

Returning to the mask 108, and with reference to the example of FIG. 2, illustrated therein is an example cross-section of the EUV mask 108 of FIG. 1. As shown in FIG. 2, the EUV mask 108 may include a substrate 202 having a backside coating layer 203, a multi-layer structure 204, a capping layer 206, and one or more absorbers 208 having an anti-reflective coating (ARC) layer 210. In some embodiments, the substrate 202 includes a low thermal expansion material (LTEM) substrate (e.g., such as $TiO_2$ doped $SiO_2$), and the backside coating layer 203 includes a chromium nitride ($Cr_xN_y$) layer. In some examples, substrate 202 has a thickness of about 6.3 to 6.5 mm. In some examples, the backside coating 203 has a thickness of about 70-100 nm. By way of example, the multi-layer structure 204 may include molybdenum-silicon (Mo—Si) multi-layers deposited on top of the substrate 202 for example, using an ion deposition technique. In some embodiments, the multi-layer structure 204 has a thickness of about 250-350 nm, and in some examples each Mo—Si layer pair has a thickness of about 3 nm (for the Mo layer) and about 4 nm (for the Si layer). In various embodiments, the capping layer 206 includes a ruthenium (Ru) capping layer, which in some examples may have a thickness of about 2.5 nm. In some embodiments, the capping layer 206 may include a Si capping layer having a thickness of about 4 nm. The capping layer 206 may help to protect the multi-layer structure 204 (e.g., during fabrication of the mask 108) and may also serve as an etch-stop layer for a subsequent absorber layer etch process. In some embodiments, the absorbers 208 may include for example, a $Ta_xN_y$ layer or a $Ta_xB_yO_zN_u$ layer, which may have a thickness of about 50-75 nm and are configured to absorb EUV light (e.g., with a wavelength of about 13.5 nm). In some examples, other materials may be used for the absorbers 208, such as Al, Cr, Ta, and W, among others. In some examples, the ARC layer 210 includes at least one of a $Ta_xB_yO_zN_u$ layer, a $Hf_xO_y$ layer, or a $Si_xO_yN_z$ layer. While some examples of materials that may be used for each of the substrate 202, the backside coating layer 203, the multi-layer structure 204, the capping layer 206, the absorbers 208, and the ARC layer 210 have been given, it will be understood that other suitable materials as known in the art may be equally used without departing from the scope of the present disclosure.

For purposes of illustration, an exemplary fabrication method for the mask 108 is herein described. In some embodiments, the fabrication process includes two process stages: (1) a mask blank fabrication process, and (2) a mask patterning process. During the mask blank fabrication process, the mask blank is formed by depositing suitable layers (e.g., reflective multiple layers such as Mo—Si multi-layers) on a suitable substrate (e.g., an LTEM substrate having a flat, defect free surface). In various embodiments, the surface roughness of the mask blank is less than about 50 nm. By way of example, a capping layer (e.g., ruthenium) is formed over the multilayer coated substrate followed by deposition of an absorber layer. The mask blank may then be patterned (e.g., the absorber layer is patterned) to form a desired pattern on the mask 108. In some embodiments, an ARC layer may be deposited over the absorber layer prior to patterning the mask blank. The patterned mask 108 may then be used to transfer circuit and/or device patterns onto a semiconductor wafer. In various embodiments, the patterns defined by the mask 108 can be transferred over and over onto multiple wafers through various lithography processes. In addition, a set of masks (such as the mask 108) may be used to construct a complete integrated circuit (IC) device and/or circuit.

In various embodiments, the mask 108 (described above) may be fabricated to include different structure types such as, for example, a binary intensity mask (BIM) or a phase-shifting mask (PSM). An illustrative BIM includes opaque absorbing regions and reflective regions, where the BIM includes a pattern (e.g., and IC pattern) to be transferred to the semiconductor substrate 116. The opaque absorbing regions include an absorber, as described above, that is configured to absorb incident light (e.g., incident EUV light). In the reflective regions, the absorber has been removed (e.g., during the mask patterning process described above) and the incident light is reflected by the multi-layer. Additionally, in some embodiments, the mask 108 may include a PSM which utilizes interference produced by phase differences of light passing therethrough. Examples of PSMs include an alternating PSM (AltPSM), an attenuated PSM (AttPSM), and a chromeless PSM (cPSM). By way of example, an AltPSM may include phase shifters (of opposing phases) disposed on either side of each patterned mask feature. In some examples, an AttPSM may include an absorber layer having a transmittance greater than zero (e.g., Mo—Si having about a 6% intensity transmittance). In some cases, a cPSM may be described as a 100% transmission AltPSM, for example, because the cPSM does not include phase shifter material or chrome on the mask.

As described above, the mask 108 includes a patterned image that may be used to transfer circuit and/or device patterns onto a semiconductor wafer (e.g., the semiconductor substrate 116) by the lithography system 100. To achieve a high fidelity pattern transfer from the patterned mask 108 to the semiconductor substrate 116, the lithography process should be defect free. As shown in FIG. 2, particles 212 may be unintentionally deposited on the surface of the capping layer 206 and can result in degradation of lithographically transferred patterns if not removed. Particles 212 may be introduced by any of a variety of methods such as during a chemical mechanical polishing (CMP) process, a cleaning process, and/or during handling of the EUV mask 108. While the particles 212 are illustrated as having a circular shape, it will be understood that other particle shapes and sizes are possible, and are intended to fall within the scope of the present disclosure.

Figure 3B:
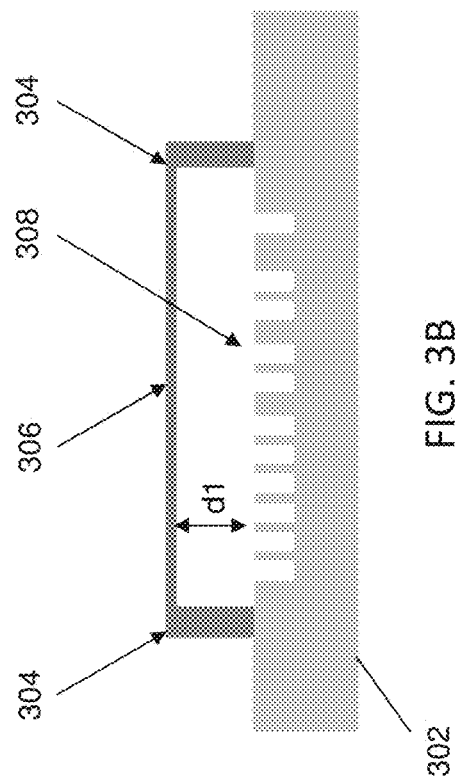
FIG. 3A is a top-view and FIG. 3B is a cross-sectional view of a mask and pellicle, according to some embodiments.
Figure 3A:
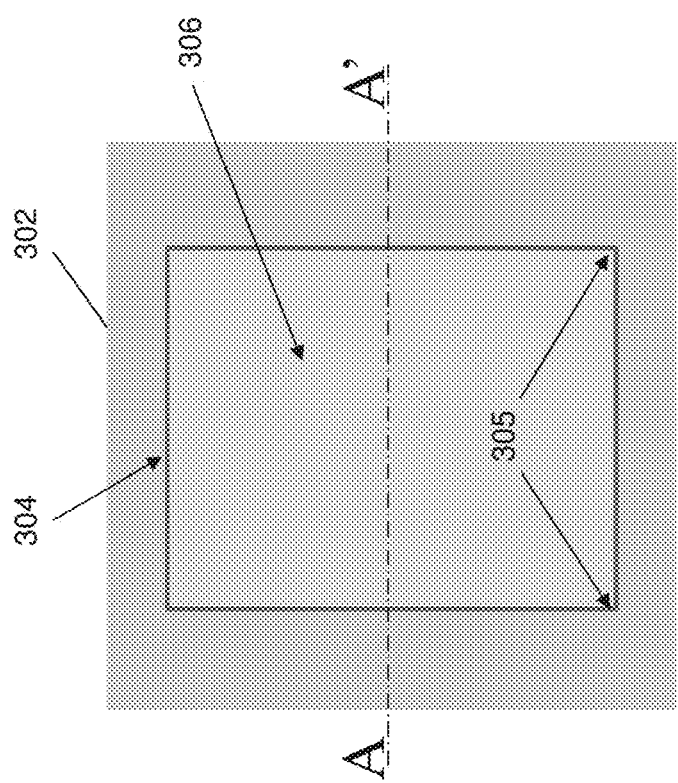

At least some existing methods for avoiding and/or removing particle contamination (e.g., particles 212) of a reflective EUV mask (e.g., the mask 108) include wet chemical processes to clean the mask. In some examples, such wet cleans may be performed with the addition of physical force, which can result in structural mask defects that can also cause a reduction in the quality of the lithographically transferred pattern. Alternatively, or in addition to, mask cleaning techniques, a pellicle membrane may be used over an EUV mask to serve as a protective cover which protects the mask from damage and/or contaminant particles. With reference to FIGS. 3A and 3B, illustrated therein is a top-view and a cross-sectional view, respectively, of a mask including a pellicle. In particular, FIGS. 3A/3B illustrate a mask 302, a pellicle frame 304, and a pellicle membrane 306. As illustrated in FIG. 3A, the pellicle (e.g., the pellicle frame 304) may include sharp corners 305 which can cause stress in the pellicle membrane 306 and that can lead to wrinkling, breakage, or other type of damage to the pellicle membrane 306. As discussed above, the mask 302 may also include a patterned surface 308 used to pattern an image into a semiconductor substrate by a lithographic process. In some embodiments, the mask 302 may be substantially the same as the mask 108, discussed above. By way of example, the pellicle membrane 306 is suspended (e.g., by the frame 304) a distance 'd1' (e.g., several millimeters) away from the patterned surface 308 of the mask 302, while remaining within an optical path between the patterned surface 308 and a wafer to be patterned, such that any particles which land on the pellicle membrane 306 (e.g., rather than on the patterned surface 308) are held away from a focal plane of the projection optics 110 and will thus not be imaged onto a target semiconductor wafer. While commonly used for optical lithography, pellicle membranes for EUV lithography have proved challenging to fabricate and implement, due at least in part to the difficulty of providing a thin, highly transmissive pellicle membrane with sufficient structural integrity to span the surface of the mask (e.g., the mask 108 or the mask 302). The fabrication of large, thin pellicle membranes according to certain conventional fabrication processes has been shown to cause the pellicle membrane to become distorted, wrinkled, broken, or otherwise damaged, thereby rendering the pellicle membrane unusable. Thus, existing EUV mask pellicle fabrication techniques have not proved entirely satisfactory in all respects.

Figure 4:
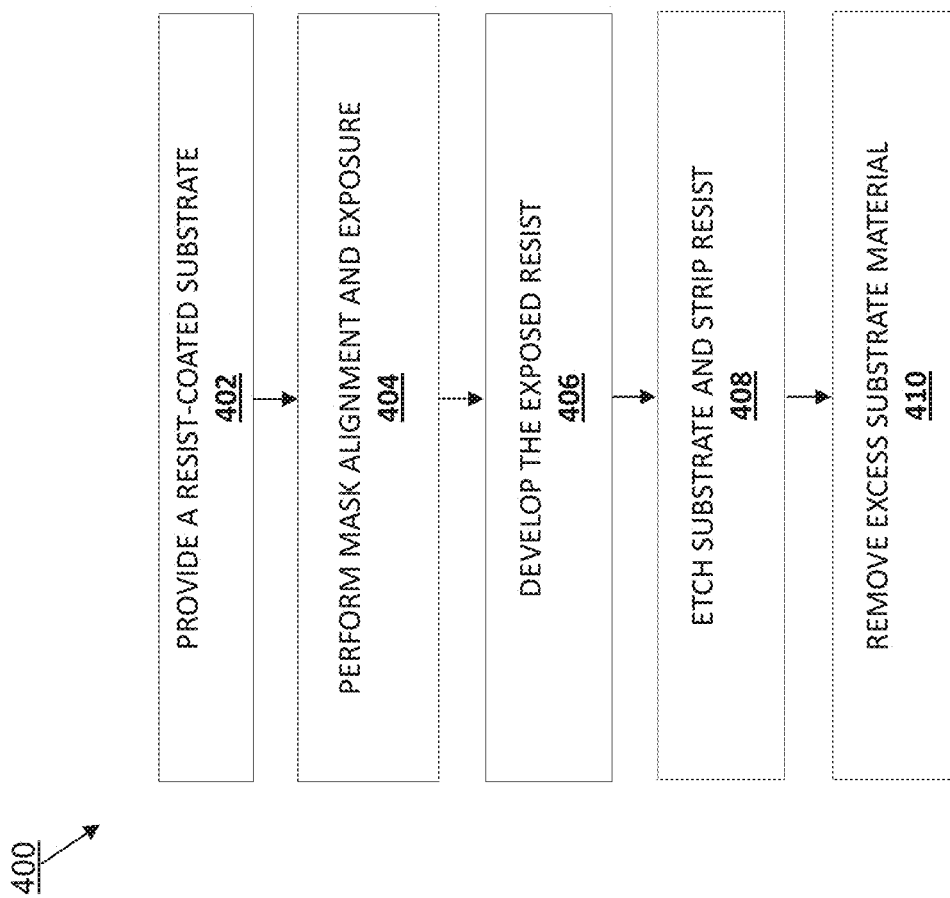
FIG. 4 is a flow chart of a method for fabricating an EUV pellicle, according to one or more aspects of the present disclosure.

In order to provide a general understanding of at least some current EUV pellicle fabrication techniques, and to expand on the shortcoming of such techniques, FIG. 4 illustrates a flow chart of a method 400 for fabricating an EUV pellicle. At least some current EUV fabrication techniques, as described herein, employ a photolithography-based approach (e.g., resist coating of a wafer, exposure, developing, etching, and resist stripping). To be sure, one or more aspects of the method of FIG. 4 may also apply to one or more aspects of the present disclosure. The method 400 begins at block 402 where a resist-coated substrate is provided. With reference to the example of FIG. 5A, in an embodiment of block 402, a resist 504 is deposited over a substrate 502, to coat a surface of the substrate 502. In some embodiments, the resist 504 includes an optical resist sensitive to UV or deep UV (DUV) light, such as Poly(methyl methacrylate) (PMMA), SU-8, or other resist as known in the art. In some examples, the resist 504 may alternatively include an EUV resist (i.e., a resist sensitive to EUV light). In various examples, the resist 504 may include a positive-tone resist or a negative-tone resist. By way of example, the resist 504 may be deposited on the substrate 502 by a spin-coating process. In some cases, after coating the substrate 502 with the resist 504, a pre-bake process may be performed, for example, to evaporate solvent(s) and to densify the resist 504.

Figure 5:
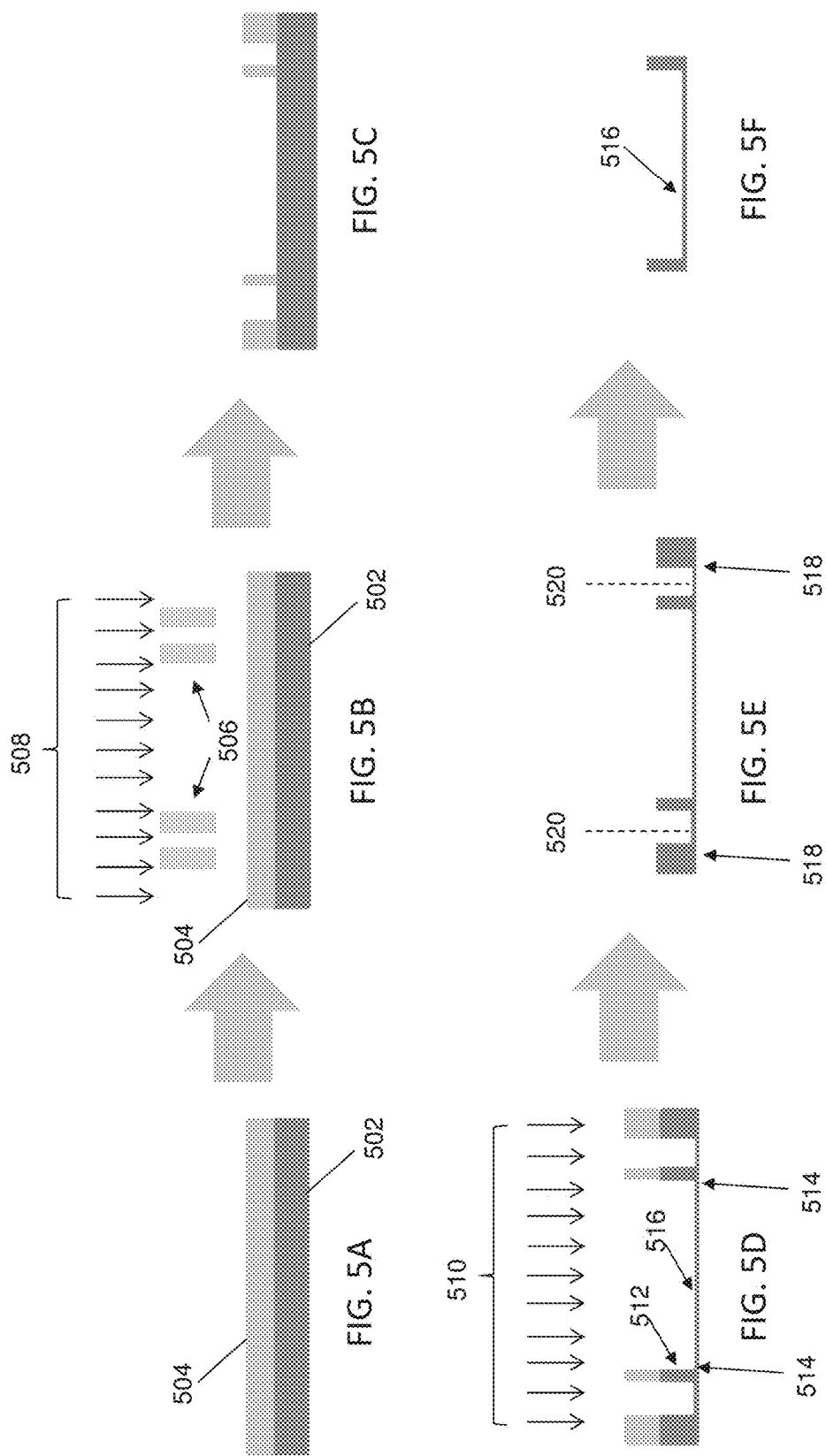
FIGS. 5A, 5B, 5C, 5D, 5E, and 5F illustrate cross-sectional views of an embodiment of EUV pellicle fabrication according to one or more aspects of the method of FIG. 4.

The method 400 proceeds to block 404 where a mask alignment and exposure is performed. With reference to the example of FIG. 5B, in an embodiment of block 404, a mask 506 is aligned over the resist-coated substrate 502. In some embodiments, the mask 506 may include a transmissive optical photomask which includes a pattern to be transferred to the resist-coated substrate 502. Alternatively, in some cases, the mask 506 may be substantially the same as the mask 108 or the mask 302, discussed above. As shown in FIG. 5B, ultraviolet light 508 (e.g., UV, DUV, or EUV) is used to expose the resist 504. In various embodiments, the exposure process forms a latent image, corresponding to the pattern of the mask 506, within the resist 504. In some examples, the alignment and exposure process of block 404 may be performed with a contact aligner, a proximity aligner, or a projection aligner. Alternatively, in some embodiments, the alignment and exposure process of block 404 may be performed with an EUV lithography system (e.g., the lithography system 100).

Thereafter, the method 400 proceeds to block 406 where the exposed resist is developed. With reference to the example of FIG. 5C, in an embodiment of block 406, a developer (e.g., a wet chemical developer) is applied to the exposed, resist-coated substrate 502. In some embodiments, regions of exposed resist 504 may be removed (e.g., in the case of a positive-tone resist). Alternately, regions of unexposed resist 504 may be removed (e.g., in the case of a negative-tone resist). As shown in FIG. 5C, after the developing process, the pattern of the mask 506 has been transferred to the resist-coated substrate 502. In some cases, after resist is developed, a post-bake process may be performed, for example, to stabilize and harden the developed resist 504. In some embodiments, such a post-bake process may also serve to remove any residual solvent material.

The method 400 proceeds to block 408 where the substrate is etched and the resist is stripped. With reference to the example of FIG. 5D, in an embodiment of block 408, the developed resist 504 (which now includes the pattern transferred from the mask 506) serves as an etch mask for an etch process 510, where the etch process 510 serves to further transfer the mask 506 pattern to the substrate 502 by way of the developed, patterned resist 504. In some embodiments, the etch process 510 includes a dry etch process (e.g., a plasma etch process) that serves to provide a substantially vertical sidewall 512 within the etched substrate 502. Alternately, in some embodiments, the etch process 510 may include a wet etch process or a combination of dry and wet etch processes. In particular, after performing the etch process 510, sharp edges 514 may be formed near a newly formed pellicle membrane 516. Consequentially, the sharp edges 514 can result in regions of concentrated stress which may cause the pellicle membrane 516 to wrinkle, break, or be damaged in some other way. In particular, with reference to the example of FIG. 5E, also in an embodiment of block 408, the resist 504 is stripped from the substrate 502. In some embodiments, the resist stripping process may include a wet stripping process, where the wet stripping process employs a solvent such as acetone, trichloroethylene (TCE), phenol-based strippers, methyl-ethyl-ketone (MEK), methyl-isobutyl-ketone (MIBK), or other solvent as known in the art. Of particular note, in cases where a wet stripping process is used to remove the resist 504, the surface tension of the solvent on the surface of the pellicle membrane 516 can result in additional stress that may cause the pellicle membrane 516 to break or otherwise be damaged. Alternately, in at least some existing processes, an anti-etching tape may be used (e.g., rather than resist deposition, exposure, and development) to define the pattern to be etched (e.g., by the etch process 510) into the substrate 502. However, even when an anti-etching tape is used, sharp edges 514 may still be formed as a result of the etch process 510. Moreover, removal of the anti-etching tape (e.g., after completion of the etch process 510) may also produce stress that can lead to deformation and/or breakage of the pellicle membrane 516.

The method 400 then proceeds to block 410 where excess substrate material is removed. With reference to the examples of FIGS. 5E and 5F, in an embodiment of block 410, after stripping the resist 504 (or removing the anti-etching tape), the pellicle membrane 516 may be separated from excess substrate material 518. For example, by cleaving the substrate 502, along a plane 520 defined by the etch process 510, the pellicle membrane 516 may be separated from excess substrate material 518. As shown in FIG. 5F, the separated pellicle membrane 516 may serve as a pellicle for an EUV lithography process. However, in view of the stress/damage which may result from at least some currently employed process for EUV pellicle fabrication (as described above), the final separated pellicle membrane 516 may not actually be usable. Therefore, underscoring the above discussion, at least some existing EUV mask pellicle fabrication techniques remain unsatisfactory.

Alternatively, embodiments of the present disclosure offer advantages over the existing art, though it is understood that other embodiments may offer different advantages, not all advantages are necessarily discussed herein, and no particular advantage is required for all embodiments. For example, embodiments of the present disclosure provide an EUV pellicle fabrication method and related structure which does not employ a lithography process, as described above with reference to the method 400. As such, embodiments of the present disclosure can be used to avoid the exposure and developing processes described above, as well as the stress-inducing resist stripping process. In addition, embodiments of the present disclosure provide for a tapered sidewall (e.g., the sidewall 512 illustrated in FIG. 5D), which serves to reduce stress in the final pellicle membrane, thereby avoiding additional stress than may damage the pellicle membrane. More specifically, embodiments of the present disclosure provide a simplified pellicle fabrication method that utilizes a thick plate (e.g., an aluminum plate, a nickel-coated aluminum plate, or a quartz plate, among others) as a hard mask during the etching process (e.g., such as the etch process 510). In various embodiments, the hard mask used in the present embodiments may be capable of resisting one or more types of plasma-based dry etching processes. In one example, the hard mask is capable of resisting a fluorine-based gas etching process. In some embodiments, the hard mask may be machined to include rounded corners, to avoid regions of concentrated stress (e.g., which appear at sharp edges 514). In addition, by tuning a thickness of the hard mask, embodiments of the present disclosure provide a method to adjust an angle of the tapered sidewall for additional stress mitigation. In the embodiments described herein, the hard mask may readily be secured to a substrate to be etched, the substrate can subsequently be etched, and the hard mask can then be removed. Those skilled in the art will recognize other benefits and advantages of the methods and devices as described herein, and the embodiments described are not meant to be limiting beyond what is specifically recited in the claims that follow.

Figure 6:
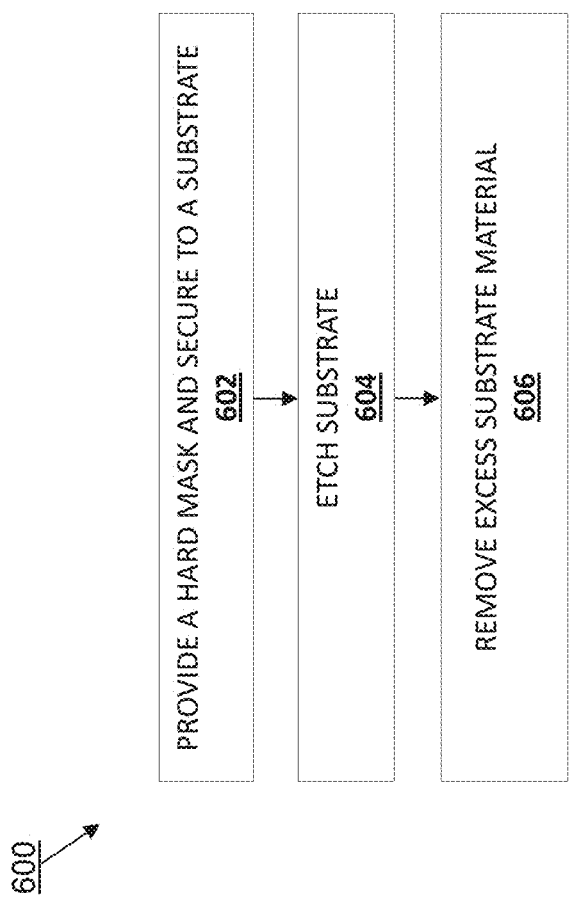
FIG. 6 is a flow chart of a simplified method for fabricating an EUV pellicle, according to one or more aspects of the present disclosure.

Referring now to FIG. 6, illustrated therein is a flow chart of a simplified method 600 for fabricating an EUV pellicle, according to one or more aspects of the present disclosure. It is noted that the process steps of the method 600, including any descriptions given with reference to FIGS. 7A/7B-10A/10B, are merely exemplary and are not intended to be limiting beyond what is specifically recited in the claims that follow. The method 600 begins at block 602 where a hard mask is provided and secured to a substrate. In some embodiments, "securing" the hard mask to the substrate may simply include resting the hard mask on the substrate. As such, the hard mask may be somewhat similar to a shadow mask. In addition, in various embodiments, the hard mask may be weighed sufficiently so as not to move while resting on the substrate during a subsequent etch process (described below). With reference to the examples of FIGS. 7A and 7B, which illustrate top- and cross-sectional views, respectively, of a substrate and hard mask in accordance with an embodiment of block 602, a hard mask 702 is provided and secured (or placed onto) a substrate 704. By way of example, the substrate 704 (which is used to form the pellicle membrane) may include a silicon substrate. In some embodiments, the substrate 704, which may include one or more thin film layers, may alternatively include silicon nitride (SiN), poly-crystalline silicon (poly-Si), silicon carbide (SiC), SiN coated Si, SiN coated poly-Si, a Si-based compound, or other suitable material such as a low-transmittance EUV material (e.g., for use as the pellicle membrane). As used herein, a "low-transmittance EUV material" may include a material having a low transmittance at EUV wavelengths. In some embodiments, prior to the method 600, a grinding and/or thinning process may be performed on a backside 701 of the substrate 704 so that a thickness of the substrate 'tsub' (when the method 600 begins) is less than a thickness of an originally provided substrate.

As illustrated in FIG. 7A, the hard mask 702 includes a membrane window 706, which serves to define a subsequently formed (e.g., etched) pellicle membrane within the substrate 704. In various embodiments, the hard mask 702 may be machined such that the membrane window 706 includes rounded corners 708, thereby mitigating stress resulting from sharp corners (e.g., the sharp corners 305 shown in FIG. 3A). As described above, the hard mask 702 may be machined from a plurality of different materials such as from an aluminum plate, a nickel-coated aluminum plate, or a quartz plate, among others. In various embodiments, the material used to fabricate the hard mask 702 may be selected, at least in part, so as to enable the hard mask 702 to resist one or more types of plasma-based dry etching processes (e.g., such as the etch process 510). In at least one example, the hard mask 702 is configured to resist a fluorine-based gas etching process. In various embodiments, the hard mask 702 further includes channels 710 which may be used to define a subsequently formed cleavage plane (formed by an etch process) that can be used to separate a pellicle membrane from excess substrate material, as described herein. As shown in FIG. 7B, the hard mask 702 also has a thickness 't', which may be tuned in order to control an angle of a tapered sidewall, as described below. Additionally, the hard mask 702 thickness 't' may be selected, at least in part, so as to enable the hard mask 702 to resist the one or more types of plasma-based dry etching processes, as described above.

Figures 8A, 8B:
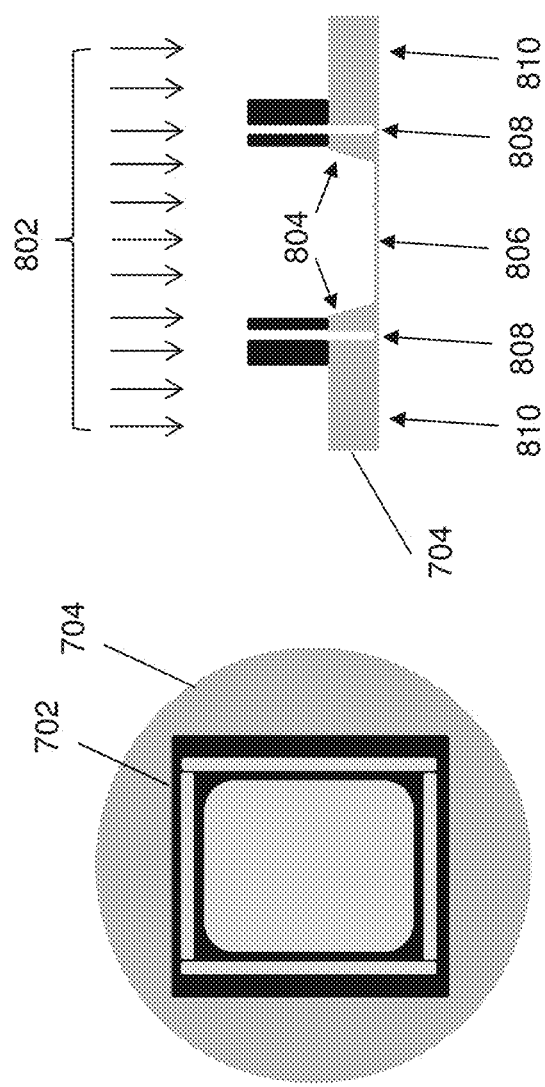
FIG. 8A is a top-view and FIG. 8B is a cross-sectional view of an embodiment of a substrate and a hard mask, after etching the substrate, according to one or more aspects of the method of FIG. 6.

The method 600 proceeds to block 604 where the substrate is etched. With reference to the examples of FIGS. 8A and 8B, which illustrate top- and cross-sectional views, respectively, of a substrate and hard mask (after etching the substrate) in accordance with an embodiment of block 604, the substrate 704 (with the hard mask 702 disposed thereon) is etched. In the present embodiments, the hard mask 702 serves as an etch mask for an etch process 802, where the etch process 802 serves to transfer the hard mask 702 pattern to the substrate 704. In some embodiments, the etch process 802 includes a dry etch process (e.g., a plasma etch process). Alternately, in some embodiments, the etch process 802 may include a wet etch process or a combination of dry and wet etch processes. In various embodiments, the thickness 't' of the hard mask 702 is selected so as to provide a tapered sidewall 804 within the etched substrate 704. For purposes of illustration, in some embodiments, the thickness 't' of the hard mask 702 may be in a range from about 5 mm to about 10 mm (1 cm). In some embodiments, the thickness 't' of the hard mask 702 may include other thicknesses, for example, as chosen based on a particular application or process condition. In some examples, the tapered sidewall 804 may be formed as a result of a shadow effect caused by the thickness 't' of the hard mask 702 during the etch process 802. As such, in various embodiments, the thickness 't' of the hard mask 702 may be tuned so as to selectively control an angle of the tapered sidewall 804. For example, the angle of the tapered sidewall 804 may be chosen (e.g., by appropriate choice of the hard mask 702 thickness 't') so as to optimally reduce stress on a subsequently formed pellicle membrane (e.g., pellicle membrane 806). Thus, in contrast to at least some existing processes, embodiments of the present disclosure serve to avoid sharp edges (such as sharp edges 514) near the pellicle membrane 806, thereby avoiding regions of concentrated stress and possible wrinkling, breaking, or other damage to the pellicle membrane 806. In addition, FIG. 8B illustrates etched channels 808, patterned by the channels 710 of the hard mask 702 during the etch process 802, which serve to define a cleavage plane used to separate the pellicle membrane 806 from excess substrate material 810. In various embodiments, a pellicle frame region is defined by a substrate region disposed between the etched pellicle membrane 806 and the etched channels 808.

Figure 9B:
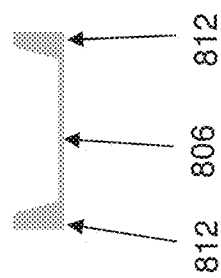
FIG. 9A is a top-view and FIG. 9B is a cross-sectional view of an embodiment of EUV pellicle, fabricated according to one or more aspects of the method of FIG. 6.
Figure 9A:
Figure 10B:
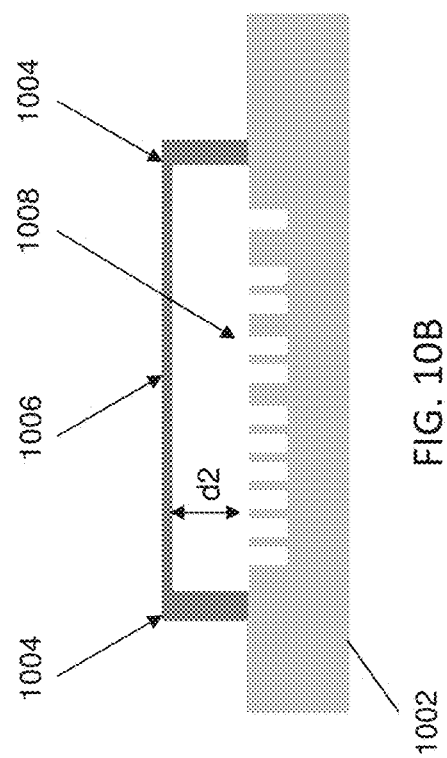
FIG. 10A is a top-view and FIG. 10B is a cross-sectional view of an EUV mask including an EUV pellicle fabricated according to one or more aspects of the method of FIG. 6.
Figure 10A:
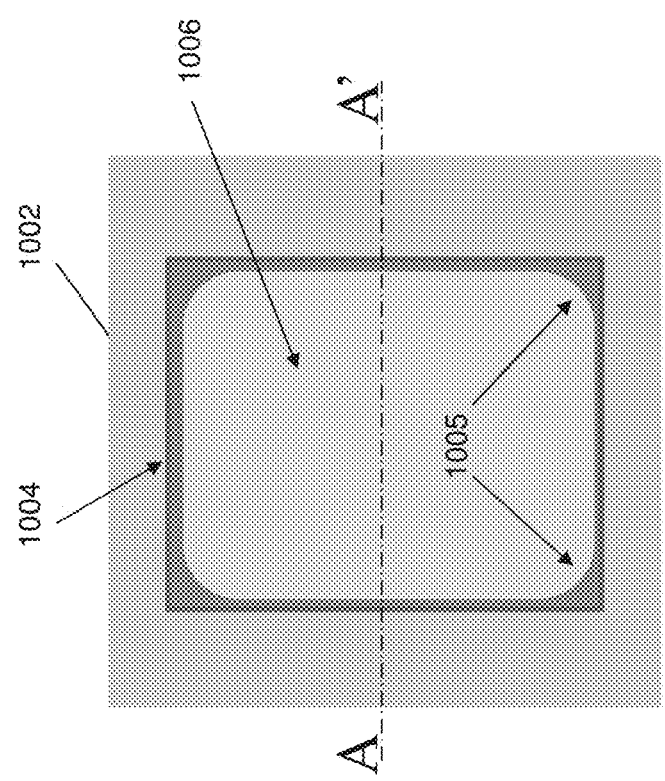

The method 600 then proceeds to block 606 where excess substrate material is removed. With reference to the examples of FIGS. 9A and 9B, which illustrate top- and cross-sectional views, respectively, of a pellicle membrane in an embodiment of block 606, after the etch process 802 and removal of the hard mask 702 from the substrate 704, the pellicle membrane 806 (and pellicle frame 812) may be separated from excess substrate material 808. For example, the substrate 704 may be cleaved along a cleavage plane defined by the etched channels 808 (FIG. 8B), thereby separating the pellicle membrane 806 from the excess substrate material 808. FIGS. 9A and 9B in particular illustrate a final, separated pellicle membrane 806 (and supporting frame 812) that may serve as a EUV pellicle for an EUV lithography process. After separation of the pellicle membrane 806 (and supporting frame 812), the pellicle may be attached to the frame such that there is no pressure delta between the pellicle and the scanner environment (e.g., by use of a vent hole and filter), and the pellicle and frame may then be mounted onto a mask (e.g., an EUV mask) for subsequent exposure processes. With reference to FIGS. 10A and 10B, illustrated therein is a top-view and a cross-sectional view, respectively, of a EUV mask including a EUV pellicle fabricated in accordance with the method 600. In particular, FIGS. 10A/10B illustrate a mask 1002, a pellicle frame 1004, and a pellicle membrane 1006. The mask 1002 may include a patterned surface 1008 used to pattern an image into a semiconductor substrate by a lithographic process. In some embodiments, the mask 1002 may be substantially the same as the masks 108 and 302, discussed above. By way of example, the pellicle membrane 1006 is suspended (e.g., by the frame 1004) a distance 'd2' (e.g., several millimeters) away from the patterned surface 1008 of the mask 1002, while remaining within an optical path between the patterned surface 1008 and a wafer to be patterned, such that any particles which land on the pellicle membrane 1006 (e.g., rather than on the patterned surface 1008) are held away from a focal plane of the projection optics 110 and will thus not be imaged onto a target semiconductor wafer. In addition, as shown in FIG. 10A, the pellicle frame 1004 includes rounded corners 1005 (as a result of the rounded corners 708 of the hard mask 702), thereby avoiding stress in the pellicle membrane 1006 that would otherwise be present due to sharp corners in the pellicle frame, such as sharp corners 305 (FIG. 3A). Thus, embodiments of the present disclosure provide a method for fabrication of a pellicle membrane for EUV lithography processes that avoids the pitfalls of current EUV pellicle fabrication processes. For example, as described above, embodiments discussed herein provide a method of forming a thin, highly transmissive pellicle membrane with sufficient structural integrity (e.g., due to a reduction in pellicle stressors such as sharp edges as well as avoidance of wet resist stripping processes) to span the surface of the mask (e.g., the mask 1002). Additional process steps may be implemented before, during, and after the method 600, and some process steps described above may be replaced or eliminated in accordance with various embodiments of the method 600. For example, in some embodiments, process steps of the method 400 may be used to augment, or otherwise modify, the process steps of the method 600.

With respect to the description provided herein, the present disclosure offers methods and structures for fabrication of a pellicle membrane for EUV lithography processes that avoids the pitfalls of current EUV pellicle fabrication processes. In some embodiments, EUV pellicle fabrication method and related structures described herein do not employ a lithography process. As such, embodiments of the present disclosure can be used to avoid the exposure and developing processes of at least some conventional pellicle fabrication methods, as well as the stress-inducing resist stripping process. In addition, embodiments of the present disclosure provide for a tapered sidewall (e.g., the sidewall 804 illustrated in FIG. 8B), which serves to reduce stress in the final pellicle membrane, thereby avoiding additional stress than may damage the pellicle membrane. More specifically, embodiments of the present disclosure provide a simplified pellicle fabrication method that utilizes a thick plate (e.g., an aluminum plate, a nickel-coated aluminum plate, or a quartz plate, among others) as a hard mask during the etching process (e.g., such as the etch process 802). In the present embodiments, the hard mask may be configured to resist one or more types of plasma-based dry etching processes, such as for example, a fluorine-based gas etching process. In some embodiments, the hard mask may be machined to include rounded membrane window corners, to avoid regions of concentrated stress. In addition, by tuning a thickness of the hard mask, embodiments of the present disclosure provide a method to adjust an angle of the tapered sidewall (e.g., the sidewall 804) for additional stress mitigation. In the embodiments described herein, the hard mask may readily be secured to a substrate to be etched, the substrate can subsequently be etched, and the hard mask can then be removed. Those of skill in the art will readily appreciate that the methods and structures described herein may be applied to a variety of other semiconductor devices to advantageously achieve similar benefits from such other devices without departing from the scope of the present disclosure.

Thus, embodiments of the present disclosure described a method for fabricating a pellicle for EUV lithography processes. In some embodiments, the method includes placing a hard mask in contact with a surface of a substrate. In some embodiments, the hard mask is configured to pattern the surface of the substrate to include a first region and a second region surrounding the first region. By way of example, while the mask in positioned in contact with the substrate, an etch process of the substrate is performed to etch the first and second regions into the substrate. Thereafter, an excess substrate region is removed so as to separate the etched first region from the excess substrate region. In various embodiments, the etched and separated first region serves as a pellicle for an EUV lithography process.

In some embodiments, discussed is a method where a plate configured to resist an etch process is received. In various examples, the plate is machined to form a hard mask having a membrane window and a channel region. The hard mask may then be placed on a substrate. In some embodiments, while the mask is on the substrate, the substrate is etched to form a pellicle membrane within the membrane window and etched channels within the channel region. In some examples, the substrate may be cleaved along a plane defined by the etched channels to separate the pellicle membrane from an excess substrate region.

In addition, some embodiments discussed a method of fabricating a pellicle for an EUV lithography process. In some embodiments, a patterned plate is placed on a substrate. By way of example, the patterned plate is configured to pattern the substrate to include a pellicle membrane region, a frame region, and a channel region surrounding the frame region. The substrate is etched while using the patterned plate as an etch mask. In various embodiments, the etching the substrate etches the pellicle membrane region and the channel region into the substrate. In addition, the frame region is defined by an unetched substrate region disposed between the etched pellicle membrane region and the etched channel region. An excess substrate region may be removed by cleaving the substrate along a plane defined by the etched channel region to separate the frame and pellicle membrane regions from the excess substrate region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   providing a substrate having a first surface, a second surface, and a first thickness;
   performing a thinning process to the second surface of the substrate to provide the substrate with a second thickness less than the first thickness;
   after performing the thinning process, placing a quartz mask in contact with the first surface of the substrate, wherein the quartz mask includes a membrane window having a rectangular shape in a plan view with rounded corners, a first mask region surrounding the membrane window, elongated channel openings surrounding the first mask region, the elongated channel openings having orthogonal adjacent sides, and a second mask region surrounding the elongated channel openings, and wherein the first mask region is connected to the second mask region at each corner of the first mask region;
   while the quartz mask is positioned in contact with the first surface of the substrate, performing an etch process of the substrate based on the quartz mask to etch a pattern into the first surface of the substrate, the etched substrate pattern including an etched pellicle membrane region corresponding to the membrane window of the quartz mask having the rectangular shape with rounded corners in the plan view, a first unetched substrate region surrounding the etched pellicle membrane region, an etched channel region surrounding the first unetched substrate region, wherein the etched channel region includes a rectangular trench, and a second unetched substrate region surrounding the etched channel region and extending to an edge of the substrate, and wherein the first unetched substrate region is connected to the second unetched substrate region at each corner of the etched substrate pattern; and
   removing an excess substrate region of the substrate, the excess substrate region including the second unetched substrate region, to separate the etched pellicle membrane region and the first unetched substrate region from the excess substrate region, wherein the etched and separated pellicle membrane region and the first unetched substrate region serves as a pellicle for an extreme ultraviolet (EUV) lithography process.

2. The method of claim 1, wherein the removing the excess substrate region includes cleaving the substrate along a plane defined by the etched channel region.

3. The method of claim 1, further comprising:
   prior to removing the excess substrate region, removing the quartz mask from the first surface of the substrate.

4. The method of claim 1, further comprising:
   based on performing the etch process, forming a tapered sidewall within the etched pellicle membrane region of the first surface of the substrate, wherein an angle of the tapered sidewall is proportional to a thickness of the quartz mask, the quartz mask in direct contact with the first surface of the substrate.

5. The method of claim 4, wherein the quartz mask thickness is within a range of about 5 mm to about 10 mm.

6. The method of claim 1, wherein the substrate includes at least one of a silicon substrate, a silicon nitride (SiN) substrate, a polycrystalline silicon (poly-Si) substrate, a silicon carbide (SiC) substrate, a SiN coated Si substrate, a SiN coated poly-Si substrate, a Si-based compound substrate, and a low-transmittance EUV material.

7. The method of claim 1, wherein an inner edge of the first unetched substrate region defines the etched pellicle membrane region having the rectangular shape in the plan view with rounded corners for stress mitigation and an outer edge of the first unetched substrate region has another rectangular shape in the plan view with orthogonal adjacent sides surrounded by the etched channel region.

8. The method of claim 1, wherein the etch process includes a plasma-based dry etch process, and wherein the quartz mask is configured to resist the etch process.

9. The method of claim 8, wherein the etch process includes a fluorine-based etch process.

10. The method of claim 1, wherein the elongated channel openings have orthogonal adjacent sides, wherein each elongated channel opening has a length oriented parallel to a different side of the membrane window, and wherein there are no other openings in the quartz mask between the membrane window and the elongated channel opening parallel to each respective side of the membrane window.

11. A method, comprising:
    receiving a plate configured to resist an etch process;
    machining the plate to form a hard mask having a membrane window with a rectangular shape in a plan view with rounded corners, a first hard mask region surrounding the membrane window, channel openings surrounding the first hard mask region, the channel openings having orthogonal adjacent sides, and a second hard mask region surrounding the channel openings, wherein the first hard mask region is connected to the second hard mask region at each corner of the first hard mask region;

placing the hard mask in direct contact with a substrate;

while the hard mask is in direct contact with the substrate, etching the substrate based on the hard mask to form a pellicle membrane corresponding to the membrane window of hard mask and having the rectangular shape with rounded corners in the plan view, a first unetched substrate region surrounding the etched pellicle membrane, etched channels surrounding the first unetched substrate region, wherein the etched channels include a rectangular trench, and a second unetched substrate region surrounding the etched channels and extending to an edge of the substrate, and wherein the first unetched substrate region connects to the second unetched substrate region at each corner of the pellicle membrane; and cleaving the substrate along a plane defined by the etched channels to separate the pellicle membrane from an excess substrate region including the second unetched substrate region.

12. The method of claim 11, wherein the pellicle membrane serves as a pellicle membrane for an extreme ultraviolet (EUV) lithography process.

13. The method of claim 11, further comprising:
based on etching the substrate, forming a tapered substrate sidewall within the membrane window.

14. The method of claim 11, further comprising:
prior to placing the hard mask in direct contact with the substrate, performing a thinning process to the substrate.

15. A method of fabricating a pellicle for an extreme ultraviolet (EUV) lithography process, comprising:
placing a patterned plate in direct contact with a substrate, wherein the patterned plate includes a pellicle membrane window having a rectangular shape in a plan view with rounded corners, a first patterned plate region surrounding the pellicle membrane window, channel openings surrounding the first patterned plate region, the channel openings having orthogonal adjacent sides, and a second patterned plate region surrounding the channel openings, wherein the first patterned plate region is connected to the second patterned plate region at each corner of the first patterned plate region;

etching the substrate while using the patterned plate as an etch mask, wherein the etching the substrate forms a patterned substrate including an etched pellicle membrane region having the rectangular shape in the plan view with rounded corners, a first unetched substrate region surrounding the pellicle membrane region, etched channels surrounding the first unetched substrate region, wherein the etched channels include a rectangular trench, and a second unetched substrate region surrounding the etched channels and extending to an edge of the substrate, wherein the first unetched substrate region connects to the second unetched substrate region at each corner of the patterned substrate; and removing an excess substrate region, the excess substrate region including the second unetched substrate region, by cleaving the patterned substrate along a plane defined by the etched channels to separate the first unetched substrate region and the pellicle membrane region from the excess substrate region.

16. The method of claim 15, wherein the etching the substrate forms a tapered sidewall along an edge of the pellicle membrane region, and wherein an angle of the tapered sidewall corresponds to a thickness of the patterned plate.

17. The method of claim 15, wherein the patterned plate includes a membrane window having a set of orthogonal straight sides coupled to one another by a rounded corner, and wherein the membrane window is used to pattern the pellicle membrane region.

18. The method of claim 15, wherein the substrate includes at least one of a silicon substrate, a silicon nitride (SiN) substrate, a polycrystalline silicon (poly-Si) substrate, a silicon carbide (SiC) substrate, a SiN coated Si substrate, a SiN coated poly-Si substrate, a Si-based compound substrate, and a low-transmittance EUV material.

19. The method of claim 15, wherein the patterned plate includes a quartz patterned plate.

20. The method of claim 15, further comprising:
prior to placing the patterned plate in direct contact with the substrate, performing a thinning process to the substrate.

* * * * *